United States Patent [19]
Hsu

[11] Patent Number: 5,924,004
[45] Date of Patent: Jul. 13, 1999

[54] MANUFACTURING METHOD FOR FORMING METAL PLUGS

[75] Inventor: Chen-Chung Hsu, Taichung, Taiwan

[73] Assignee: United Microelectronics Corp., Taiwan

[21] Appl. No.: 08/917,385

[22] Filed: Aug. 26, 1997

[30] Foreign Application Priority Data

Mar. 31, 1997 [TW] Taiwan ................................. 86104117

[51] Int. Cl.⁶ .............................................. H01L 21/4763
[52] U.S. Cl. .......................... 438/622; 438/637; 438/647; 438/649; 438/655; 438/657; 438/672; 438/675; 438/682; 438/664; 438/629
[58] Field of Search .................................... 438/622, 637, 438/647, 649, 655, 657, 672, 675, 682, 664, 629

*Primary Examiner*—John F. Niebling
*Assistant Examiner*—David A Zarneke
*Attorney, Agent, or Firm*—Finnegan, Henderson, Farabow, Garrett & Dunner, L.L.P.

[57] ABSTRACT

A method for forming metal plugs using fewer masks and photolithographic processes than a conventional one and therefore able to simplify the overall manufacturing processes and reduce cost. The steps are:

providing a substrate having a polysilicon gate, a source/drain region and a spacer formed on the sidewall of the polysilicon gate;

forming a self-aligned metal silicide layer above the substrate and covering the polysilicon gate as well as the surface of the source/drain region;

forming a first dielectric layer above the substrate, and then a first conducting layer above the first dielectric layer;

using a photolithographic process to define a pattern on the first conducting layer and then etching the first dielectric layer to a certain depth;

forming a second dielectric layer above the substrate;

etching the first dielectric layer and the second dielectric layer until the metal silicide layer is exposed so as to form contact windows in designated regions; and forming metal plugs inside the contact windows.

6 Claims, 12 Drawing Sheets

MANUFACTURING METHOD FOR FORMING METAL PLUGS

BACKGROUND OF THE INVENTION

1. Field of the Invention

This invention relates to a manufacturing method for forming metal plugs, and, more particularly, to a method for forming metallic interconnection plugs within semiconductor components.

2. Description of Related Art

In the conventional process for manufacturing integrated circuits in general, with the exception of a few functionally simple circuits, such as mask ROMs or other moderately complex circuits in which components can be interconnected by a single polycide layer and a metallic layer, most moderate to complex integrated circuits require more complex schemes for circuit interconnection. As the size of the integrated circuits is decreased, sufficient surface area is not available to accomodate all the necessary interconnected wirings. As a result, semiconductor circuit designs having two or more metallic layers are becoming essential. In particular, for functionally complex circuits such as microprocessors, up to four or five metallic layers of interconnections are necessary to interconnect all circuit components.

In multi-layered metallic wiring systems, in order to avoid short-circuiting between different metallic wiring layers through direct contact (with the exception of designated contacting points), an insulating layer must be provided between the metallic layers. Such insulating layers are formed of dielectric material and are generally referred to in the art as the inter-layer dielectrics. To connect the different metallic layers in an integrated circuit, a metal plug is used.

FIGS. 1A through 1H show the conventional manufacturing method for forming metal plugs. First, on a silicon substrate 10, P-type or N-type ions are implanted to form a doped region 12 acting as a basic component for the integrated circuit, and in this example, an N-type implant is used. Then, a dielectric layer 14, for example, a silicon oxide or a silicon nitride layer, is formed above the silicon substrate 10. Using a photolithographic process (employing one mask), a contact window 15 is formed by etching the dielectric layer 14 until the silicon substrate surface for subsequent connection is reached. Thereafter, a layer of plug metal 16 (for example, tungsten) is deposited above the dielectric layer 14 and also filling the contact window 15, and then the plug metal layer 16 is etched back until the underlying surface of the dielectric layer 14 is exposed. Next, a conducting layer 18 is formed above the dielectric layer 14 and the exposed plug metal layer 16. Using another mask, a pattern is defined on the conducting layer 18, followed by the formation of another dielectric layer 20 on top of the patterned conducting layer 18. Again using another photolithographic process and yet another mask, the dielectric layer 20 is etched to form another contact window 21 which exposes the surface of the conducting layer 18 beneath for subsequent connection. Finally, another layer of plug metal 22 is deposited above the dielectric layer 20, filling the contact window 21, and then etched back until the dielectric layer 20 is exposed to form the metal plug 22.

Although much of the difficulties in metallic wiring interconnections presented by a conventional single metal layer or a single polycide layer design of integrated circuits are overcome by the foregoing method for forming a metal plug, there remain several deficiencies leaving room for improvement.

For example, in the conventional method for forming a metal plug, as described above, several separate photolithographic operations using different masks are required, which requires much production time and expense. Furthermore, repeated applications of tungsten deposition followed by etching back add complications to the overall manufacturing operation.

SUMMARY OF THE INVENTION

It is therefore an object of this invention to provide a method for forming metal plugs which reduces production time and costs by reducing the number of photolithographic and mask making steps.

Another object of this invention is to provide a method for forming metal plugs, which is suitable for different manufacturing processes, simplifying production and therefore reducing the overall production cycle time.

A third object of this invention is to provide a method for forming metal plugs that is capable of using the same mask to define a pattern on both a first metallic layer and a dielectric layer.

The advantages, purpose, and other objects of the invention will be set forth in part in the description which follows, and in part will be obvious from the description, or may be learned by practice of the invention. The advantages and purpose of the invention will be realized and attained by means of the elements and combinations particularly pointed out in the appended claims.

To attain the objects and advantages, and in accordance with the purpose of the invention, as embodied and broadly described herein, the invention is directed to a manufacturing method for forming metal plugs comprising steps of: providing a substrate having a polysilicon gate, a source/drain region and a spacer formed on the sidewall of the polysilicon gate; forming a self-aligned metal silicide layer on the substrate, the metal silicide layer covering the polysilicon gate and the source/drain region; forming a first dielectric layer above the substrate, and then a first conducting layer above the first dielectric layer; providing a mask pattern on the first conducting layer and then etching the first dielectric layer to a certain depth; forming a second dielectric layer above the substrate; etching the first dielectric layer and the second dielectric layer until the metal silicide layer is exposed so as to form contact windows in designated regions; and forming metal plugs in the contact windows.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate an embodiment of the invention and together with the description, serve to explain the principles of the invention. In the drawings.

DESCRIPTION OF THE PREFERRED EMBODIMENT

Reference will now be made in detail to the present preferred embodiment of the invention, an example of which is illustrated in the accompanying drawings. Wherever possible, the same reference numbers will be used throughout the drawings to refer to the same or like parts.

Figure 1B:
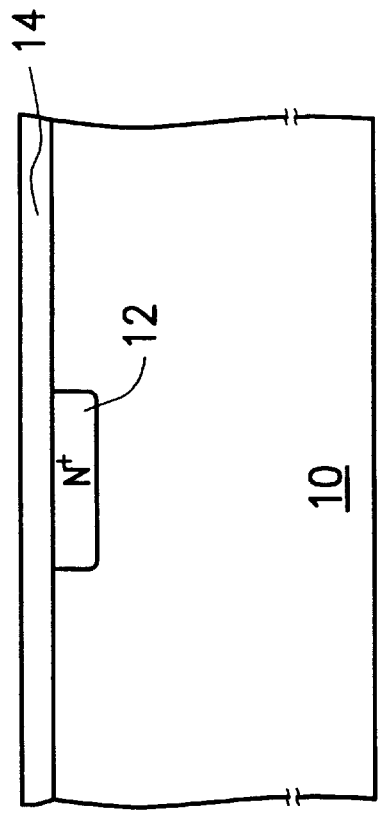
FIGS. 1A through 1H are a series of diagrams showing the conventional manufacturing steps for forming of a metal plug.
Figure 1A:
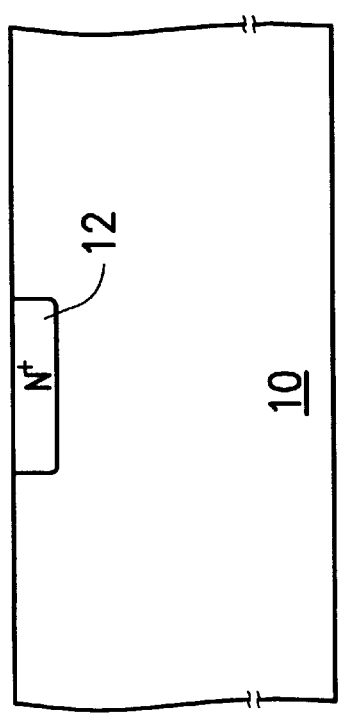
Figure 1D:
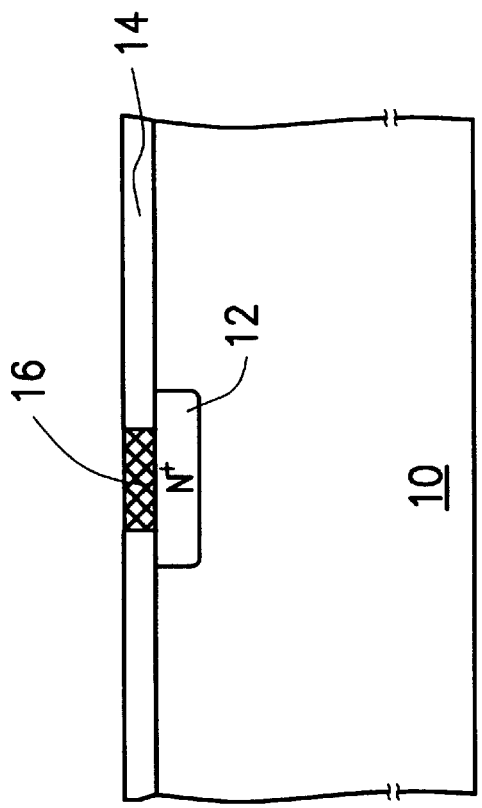
Figure 1C:
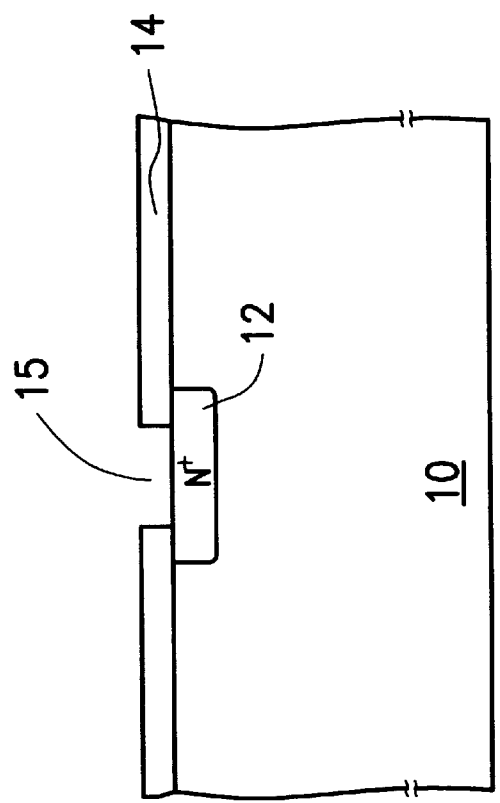
Figure 1F:
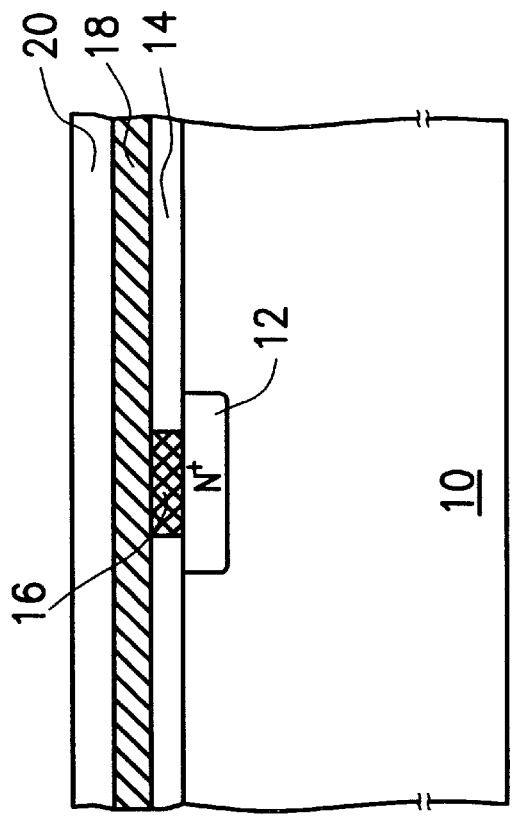
Figure 1E:
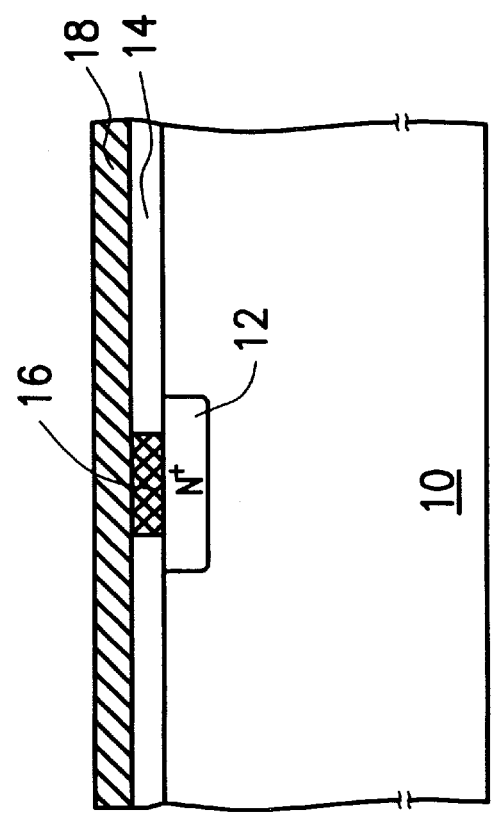
Figure 1H:
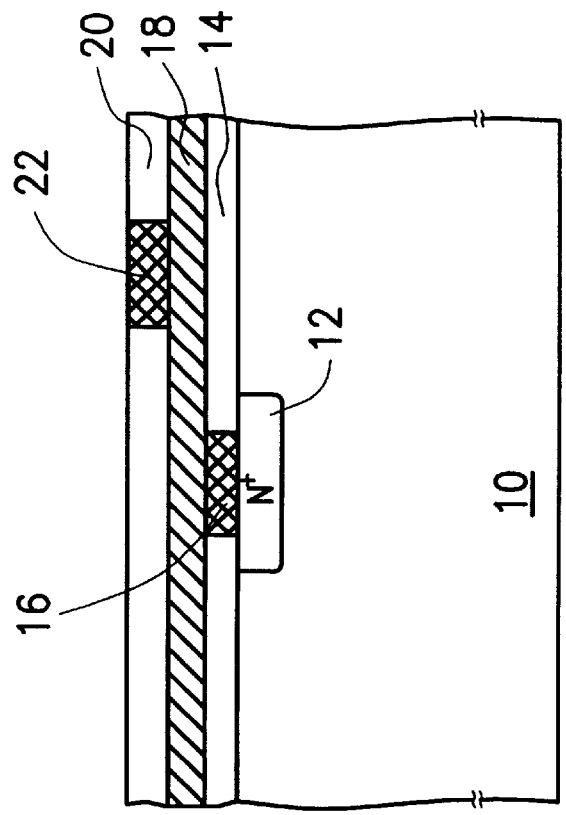
Figure 1G:
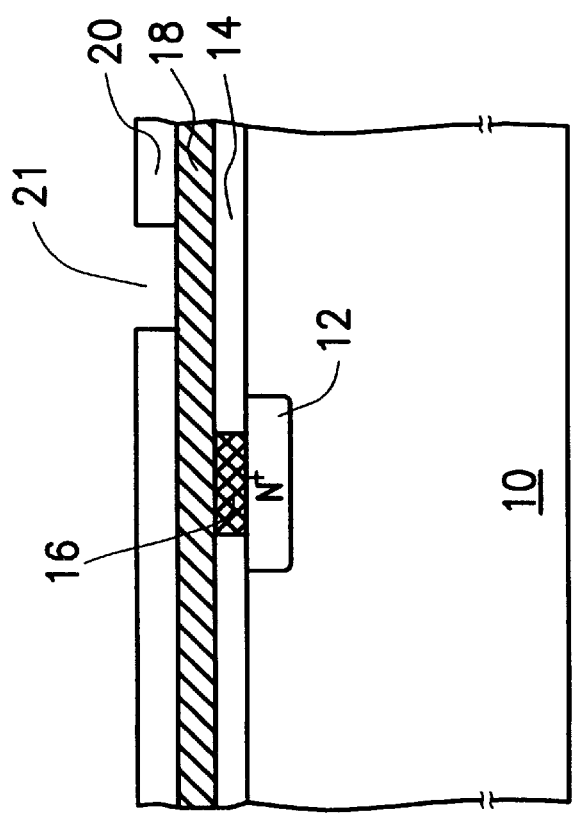
Figure 2B:
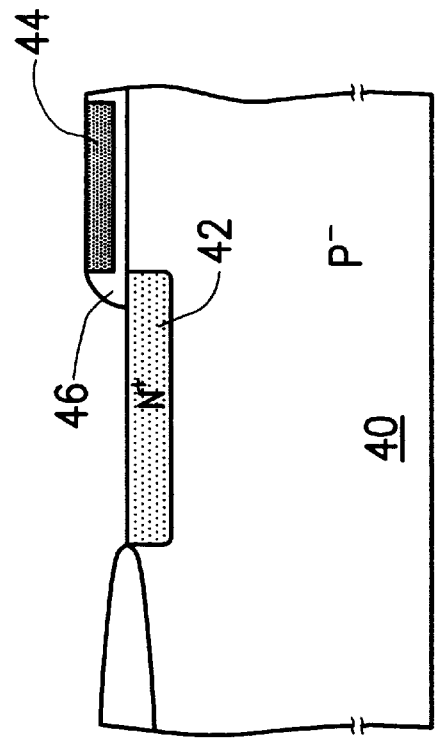
FIG. 2B is a cross section on line I—I of FIG. 2A showing the substrate according to this invention.
Figure 2A:
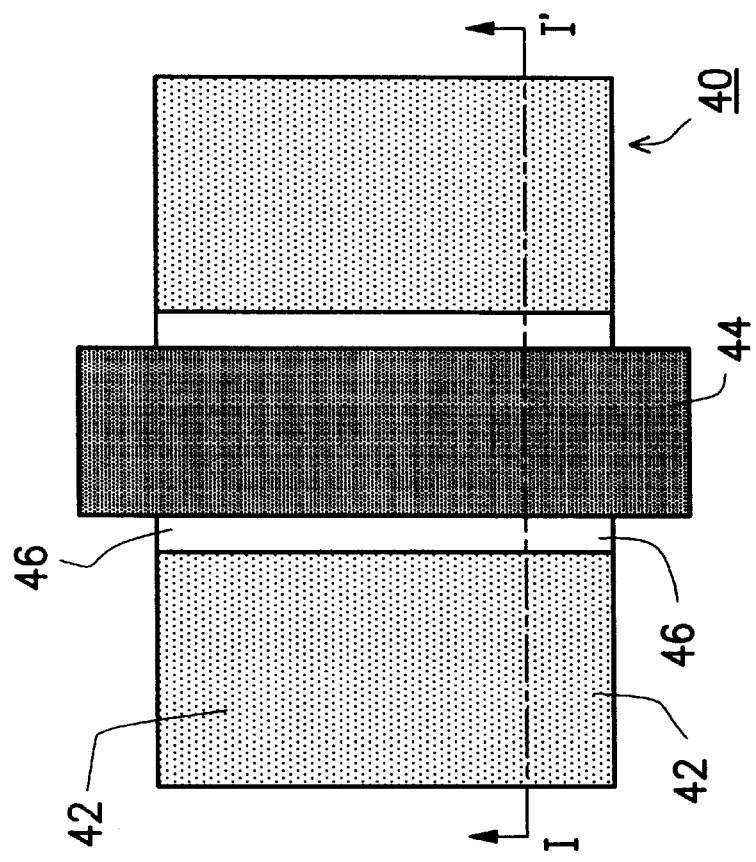
FIG. 2A is a fragmentary plan view showing the substrate according to this invention.

First, as shown in FIGS. 2A and 2B, a substrate 40, for example, a semiconductor substrate or a silicon substrate, is provided. Then, a P-doped or an N-doped source/drain region 42 (an N-doped source/drain region is used in this example), a polysilicon gate 44 and a sidewall spacer 46 formed on the sidewall of the polysilicon gate 44 are formed on the top surface of the substrate 40. The doped source/drain region 42 and the polysilicon gate 44 act as the basic components of a transistor in an integrated circuit.

Figure 3B:
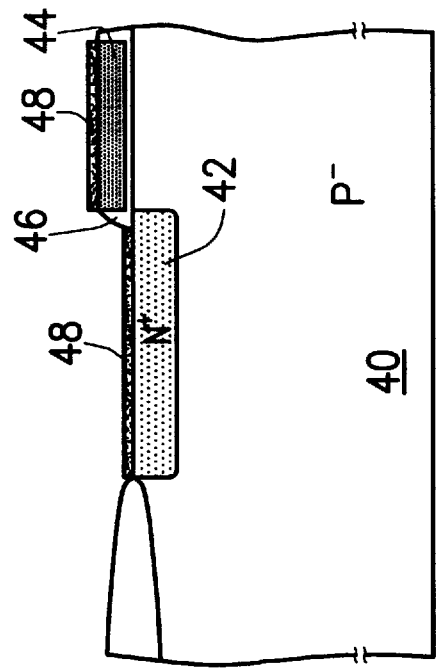
FIG. 3B is a cross section on line II—II of FIG. 3A showing the formation of a self-aligned metal silicide layer.
Figure 3A:
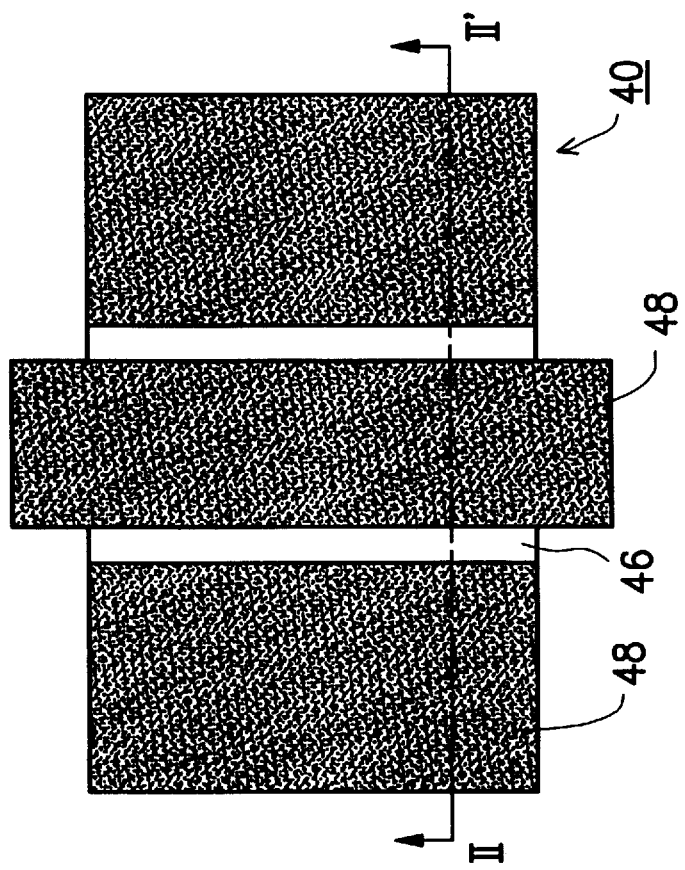
FIG. 3A is a fragmentary plan view showing the formation of a self-aligned metal suicide layer.

A self-aligned metal silicide layer 48 is formed above the substrate 40, for example, and as depicted in FIGS. 3A and 3B, by first sputtering a layer of titanium, and then allowing the titanium to react with the silicon on the surface of the substrate 40 to form a titanium silicide layer. Thereafter the unreacted titanium is removed, using a selective etchant solution, leaving behind the self-aligned layers 48 of metal silicide, covering respectively, the polysilicon gate 44 and the surface of the source/drain region 42.

Figure 4:
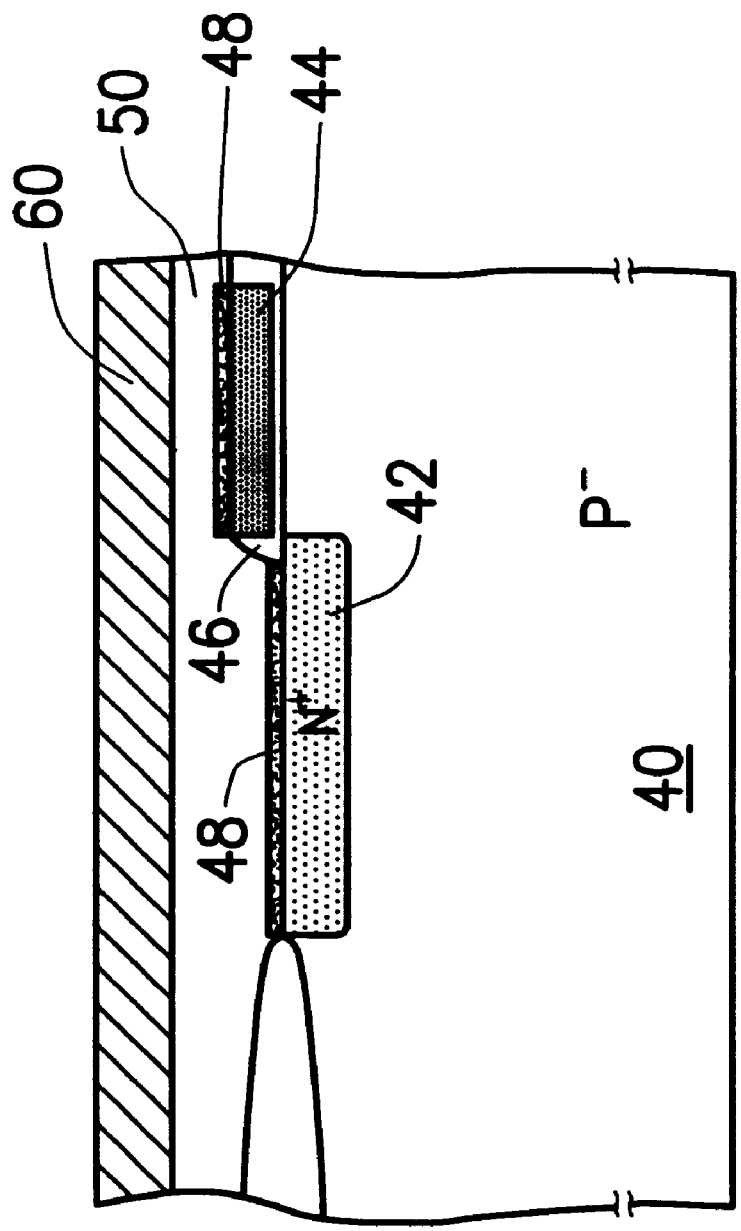
FIG. 4 is a fragmentary plan view showing the step in the deposition of the first dielectric layer and the first conducting layer.

In the subsequent step shown in FIG. 4, a first dielectric layer 50 is formed above the substrate 40, covering the surfaces of previously formed layers. The dielectric layer 50 can be a layer of borophosphosilicate glass (BPSG) formed by a chemical vapor deposition method, such as plasma enhanced chemical vapor deposition (PECVD), atmospheric pressure chemical vapor deposition (APCVD), or sub-atmospheric chemical vapor deposition (SACVD), using tetra-ethyl orthosilicate (TEOS, with chemical formula $Si(OC_2H_5)_4(g)$), Ozone/Oxygen ($O_3/O_2$), tri-ethyl-phosphate (TMP) and tri-ethyl-boate (TMB) as the reactive gases, operating under a temperature of between 400° C. to 500° C. and a reaction chamber pressure of around 10 Torr. Thereafter, a first conducting layer 60 is formed above the first dielectric layer 50, for example, using sputtering method to form a metallic layer or a doped polysilicon layer.

Figure 5B:
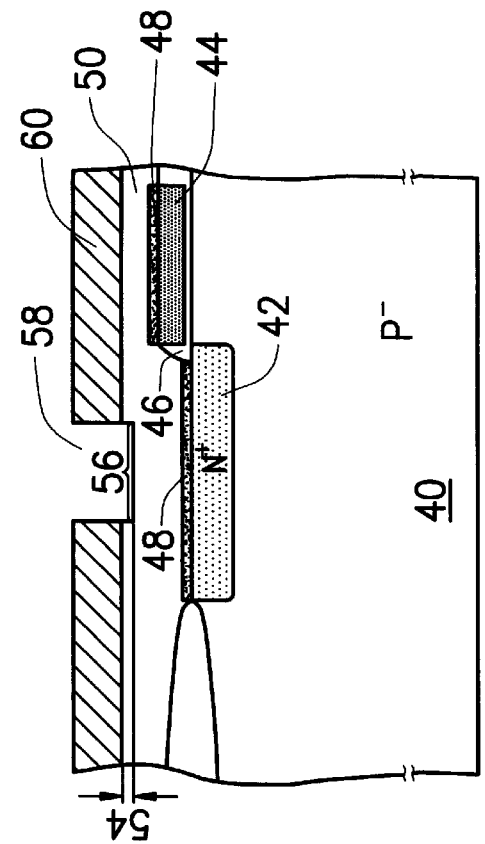
FIG. 5B is a cross section on line III—III of FIG. 5A showing the process of etching.
Figure 5A:
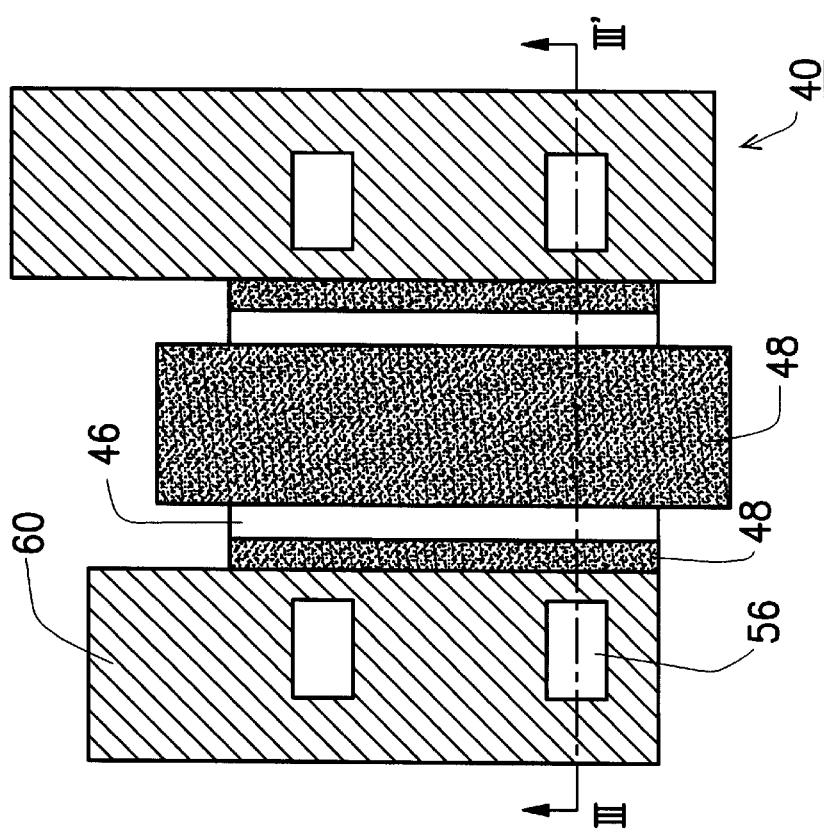
FIG. 5A is a fragmentary plan view showing the process of etching.
Figure 6:
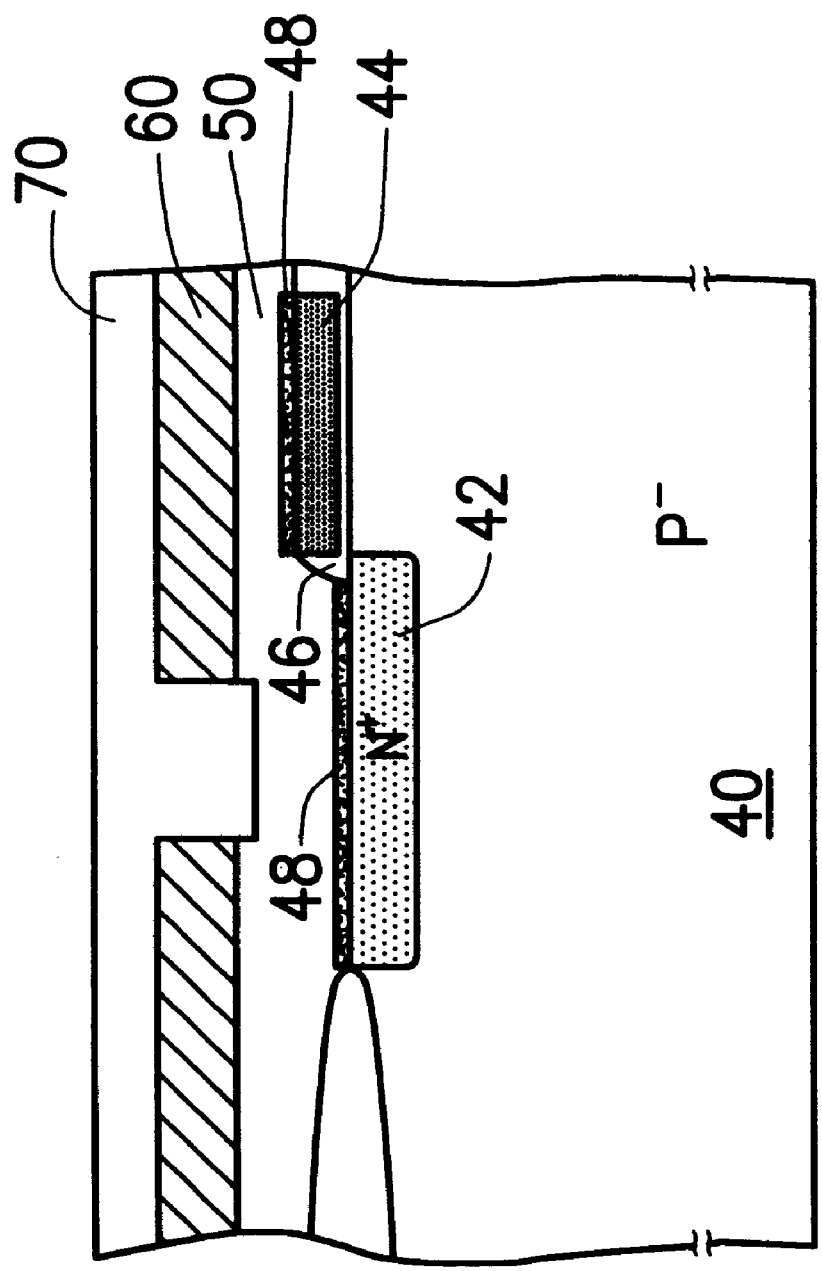
FIG. 6 is a fragmentary plan view showing the deposition of the second dielectric layer.

As depicted in FIGS. 5A, 5B and 6, a photolithographic process is applied to define a mask pattern on the first conducting layer 60, and then contact window openings 56 are etched out in the metallic layer using the same photomask for the desired location of each contact window location (part of the oxide layer will also be etched by the reactive ion etching (RIE) gases during the metallic layer etching process, this is natural and is the result of different etching rate between the metallic and the oxide layer). Thereafter, a second dielectric layer 70 (also known as intermetallic dielectric (IMD) layer) is formed above the first conducting layer 60 and the first dielectric layer 50. For example, a photolithographic process is first used to define a pattern on the first conducting layer 60 so that a pattern opening in the metal is formed above each of the contact window locations, and so that only one photomask and one photolithographic process is needed to form the contact windows 58 leading from the first conducting layer 60 to the first dielectric layer 50.

Figures 7A, 7B:
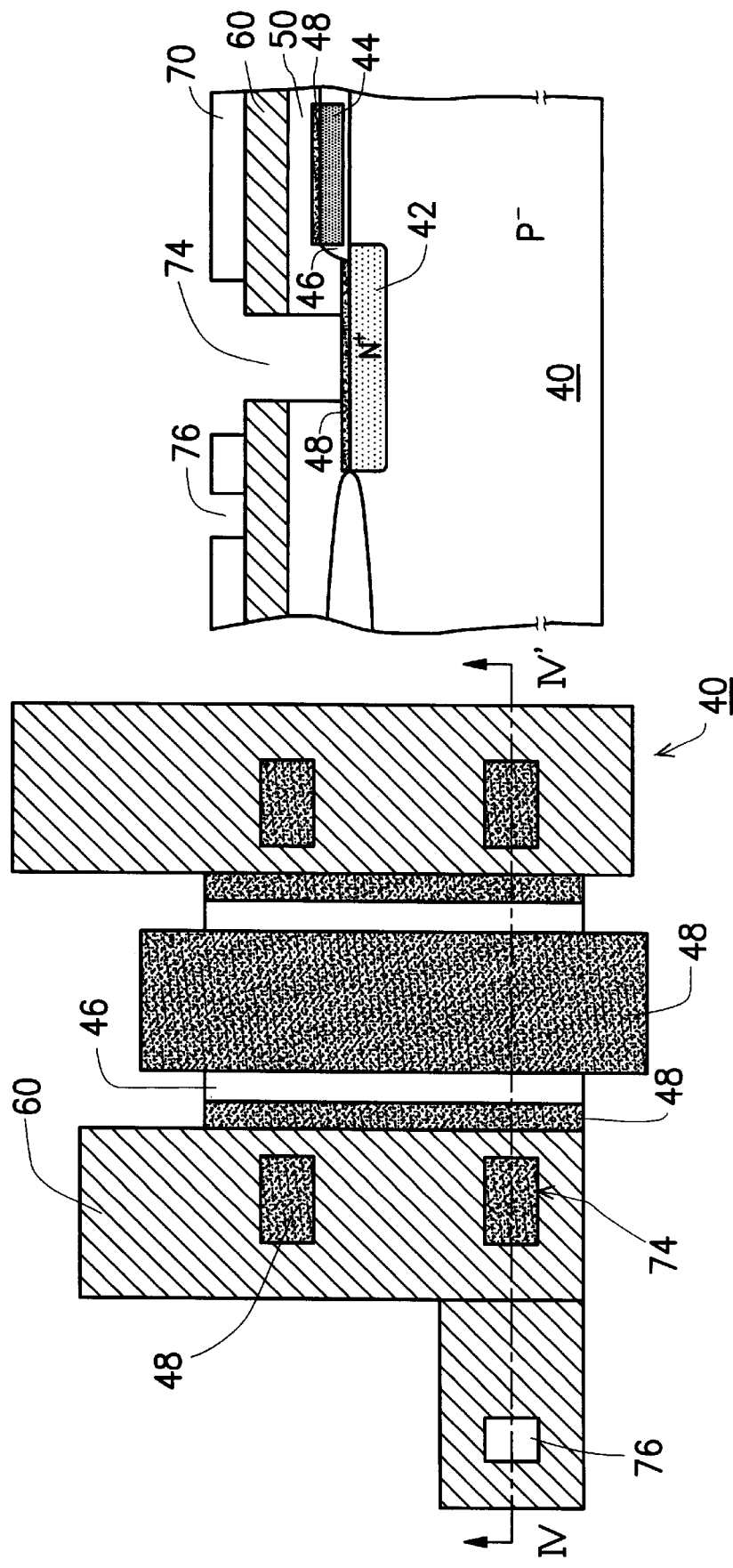
FIG. 7A is a fragmentary plan view showing the formation of contact windows.
FIG. 7B is a cross section on line IV—IV of FIG. 7A showing the formation of contact windows.

In FIGS. 7A and 7B, inter-layer windows 74 and 76 are formed by etching the first dielectric layer 50 and the second dielectric layer 70 in regions where contact is desired. For example, the first dielectric layer 50 and the second dielectric layer 70 are etched until the surface of the silicide layer 48 is exposed to form contact windows 74 in regions where contact is desired, as well as to form other inter-layer windows 76. Also, note that the above etching process must ensure the complete removal of the second dielectric layer previously formed inside the contact window 58. As a result of the process arrangement described above, it can be seen that only one photomask and one application of photolithographic processing is required to form both the inter-layer windows as well as the contact windows.

Figures 8A, 8B:
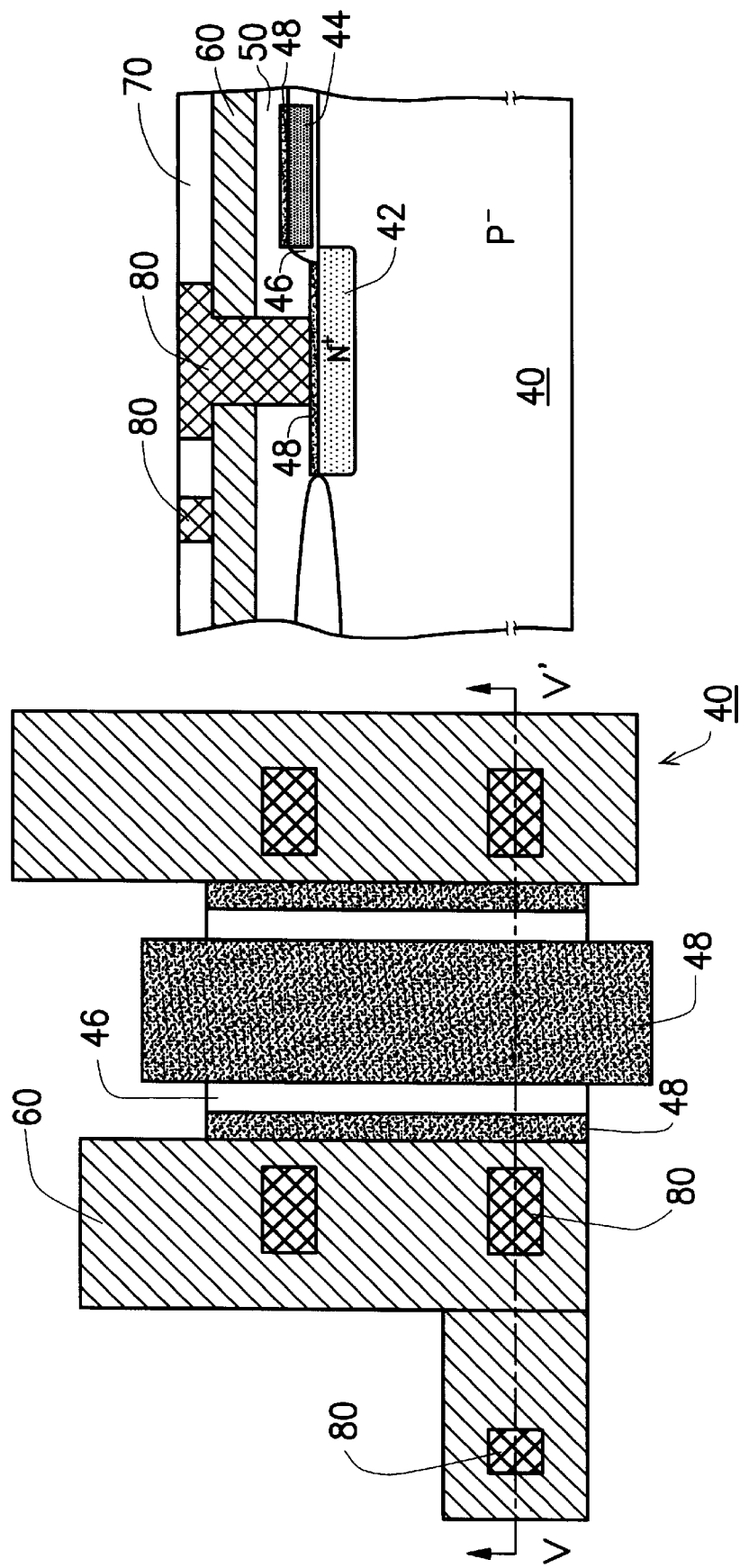
FIG. 8A is a fragmentary plan view showing the formation of metal plugs.
FIG. 8B is a cross section on line V—V of FIG. 8A showing the formation of metal plugs.

As shown in FIGS. 8A and 8B, metal plugs 80 are formed inside the contact windows 74 and 76. For example, plug metal (for example, tungsten) is first sputtered into the the contact windows 74 and inter-layer windows 76, over the second dielectric layer 70. This is followed by etching back of plug metal 80 until the surface of the second dielectric layer 70 is reached, thus removing the extra plug metal 80.

Figures 9A, 9B:
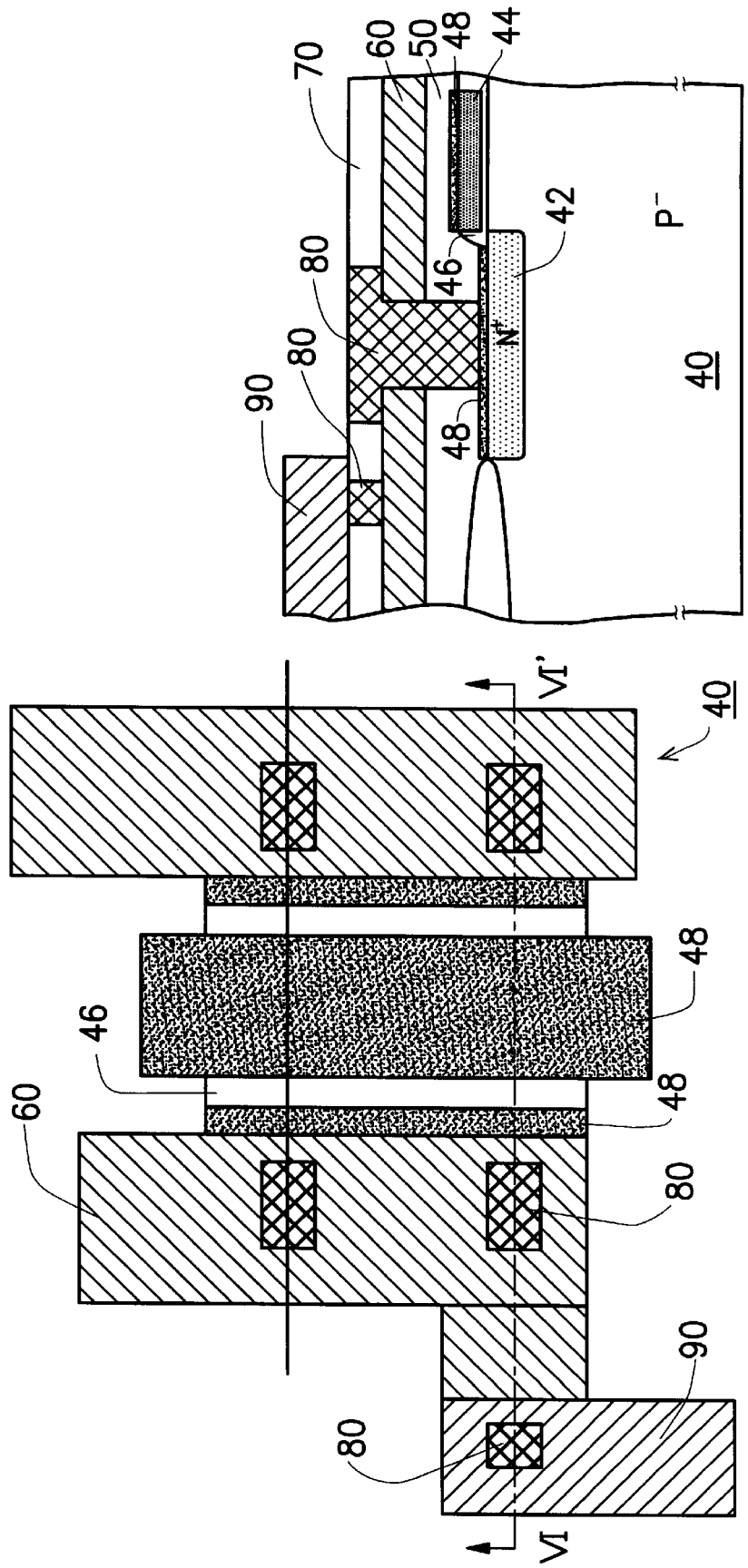
FIG. 9A is a transparent view showing the formation of a second conducting layer.
FIG. 9B is a cross section on line VI—VI of FIG. 9A showing the formation of a second conducting layer.

Lastly, and as shown in FIGS. 9A and 9B, a second conducting layer 90, acting as interconnection between semiconductor devices is formed over various aforementioned layers, and then subsequent back-end processes leading to the completion of the semiconductor component are performed.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A manufacturing method for forming metal plugs in integrated circuits, comprising steps of:

providing a substrate having a polysilicon gate, a source/drain region and a spacer formed on the sidewall of the polysilicon gate;

forming a self-aligned metal suicide layer on the substrate, the metal silicide layer covering the polysilicon gate and the source/drain region;

forming a first dielectric layer above the substrate, and then a first conducting layer above the first dielectric layer;

providing a mask pattern on the first conducting layer and then etching the first dielectric layer to a certain depth;

forming a second dielectric layer above the substrate;

etching the first dielectric layer and the second dielectric layer until the metal silicide layer is exposed so as to form contact windows in designated regions; and forming metal plugs in the contact windows.

2. The manufacturing method of claim 1, wherein the first dielectric layer is a borophosphosilicate glass layer deposited by chemical vapor deposition.

3. The manufacturing method of claim 1, wherein the second dielectric layer is a borophosphosilicate glass layer deposited by chemical vapor deposition.

4. The manufacturing method of claim 1, wherein the first conducting layer comprises one of tungsten, an aluminium/silicon/copper alloy and polysilicon.

5. The manufacturing method of claim 1, wherein the plug metal includes one of tungsten and a metallic polycide layer.

6. The manufacturing method of claim 1, wherein the metallic silicide layer is a titanium silicide layer.

* * * * *